Jan. 12, 1965 C. E. BENJAMIN 3,165,429

METHOD OF MAKING A DIFFUSED BASE TRANSISTOR

Filed Jan. 31, 1962

WITNESSES
Edwin E. Bassler
James F. Young

INVENTOR
Charles E. Benjamin
BY C. L. Menzemer
ATTORNEY

United States Patent Office 3,165,429
Patented Jan. 12, 1965

3,165,429

METHOD OF MAKING A DIFFUSED BASE TRANSISTOR

Charles E. Benjamin, Penn Hills, Pa., assignor to Westinghouse Electric Corporation, East Pittsburgh, Pa., a corporation of Pennsylvania Filed Jan. 31, 1962, Ser. No. 170,011
4 Claims. (Cl. 148—177)

This invention relates to a method of making a semiconductor device and particularly to a method of making an electrical contact to a relatively thin, diffused base region in a transistor device.

In the semiconductor art, it is highly desirable to produce transistor devices having high frequency characteristics and particularly to produce such devices which are capable of oscillating or amplifying at frequencies up to 300 mc. and higher. In conventional PNP or NPN transistors, the upper frequency limit is primarily controlled by several basic factors including the time it takes for a hole or electron to travel through the base region, the input resistance and the collector capacitance. Conventional alloy-junction transistors having relatively thin, uniform base regions have been found effective in reducing the transit time of such devices considerably but generally are functionally limited to still a relatively low upper frequency limit for many purposes, especially for use in amplifiers operating at VHF television frequencies.

It has been found further, however, that the transit time of a given base dimension can be substantially reduced by establishing a field within the relatively thin base region that will accelerate the migration of injected minority carriers from the emitter to the collector. Such a field can be established by varying the resistivity of the base region so that the resistivity is low near the emitter region and high near the collector region. The resistivity profile of a base region in a transistor device can be controlled by the distribution of a conductivity determining impurity employing various diffusion methods well known in the art. In diffused base PNP transistors, the donor density is greatest in the low resistivity region near the emitter. The "conduction" electrons in this low resistivity region tend to migrate across the base region toward the collector junction because of their concentration gradient. As a result, an electric field is set up due to the resultant positive charge of the atoms in the base region nearest the emitter. The holes injected by the emitter are accelerated by the electric field toward the collector because of their positive charge. The electric field in the base region reduces the transit time to about one-fourth of that of a conventional alloy-junction transistor of the same base dimension. In addition to an improvement in in-transit time, the high frequency performance is improved because the low resistivity of the base region near the emitter reduces the input resistance. Also the high resistivity near the collector junction results in low collector capacitance.

In the manufacture of one type of transistor device having a relatively high frequency operating capability, a conductivity determining impurity is vapor diffused into a surface of a semiconductor body to convert a thin surface region to either N or P-type and thus provide a diffused base region having a graded resistivity profile and a collector region in the unconverted portion of the body. An alloy which will produce a regrowth layer having the same type of semiconductivity as the unconverted portion of the first body is then fused to this surface, placed onto the same surface of the diffused base region in the form of a pellet or a vacuum evaporated film of controlled shape and a PNP or NPN transistor device results having an abrupt emitter junction and a graded collector junction. To complete the device, electrical contacts are attached to each of the respective regions.

In making the electrical contacts to the respective regions of such a diffused base transistor there are several important considerations involved with respect to the selection of a proper contact alloy material and also in the technique employed in attaching the electrical contact to the diffused base region, which if not considered will appreciably affect the operating characteristics of the device. First, with respect to the alloy material used, an alloy should be selected in each instance which will provide a non-rectifying junction at each respective point of contact. Second, with respect to the method of attaching the electrical contact to the device, a technique should be employed in attaching the base contact so that the graded resistivity profile of the relatively thin diffused base region will be preserved. By the use of ordinary techniques for attaching base contacts, the penetration of the fused contact must be closely controlled so as not to disturb the graded resistivity profile which normally occurs. Close control of the contact penetration can in some instances be avoided by attaching the base contact at a distance removed from the active area so as not to affect the built-in electric field where it performs a useful function. This, however, results in excessive transverse base resistance, which also is an undesirable feature.

This penetration problem is more serious with the alloyed base contact than with the alloyed emitter, even though with the aforementioned order of fabrication operations the required penetration depths are comparable. This is because the emitter contact can be evaporated through a simple mask before fusion, but the masking for an evaporated annular base contact is excessively complex. Evaporation allows much shallower penetration than conventional alloying techniques, but shapes are limited by mask-making capabilities.

Accordingly, the general object of this invention is to provide a method of making a semiconductor device having high frequency characteristics.

Another object of this invention is to provide a method of making a transistor device having a relatively thin, diffused base region, having high frequency characteristics.

A further object of this invention is to provide a method of making an electrical base contact to a transistor device having a relatively thin diffused base region.

Another, more specific object of this invention is to provide a method of making an electrical base contact to a transistor device having a relatively thin diffused base region without interrupting the graded resistivity profile across the entire area of the diffused base region.

For a better understanding of the nature and objects of the present invention, reference should be had to the following detailed description and drawing in which.

In accordance with the present invention a method is provided for attaching an electrical contact to a relatively thin diffused region having a given type of semiconductivity in a body of semiconductor material, by first attaching the electrical contact to a surface of the body and then vapor diffusing a conductivity determining impurity which will impart the given type of semiconductivity of the diffused region into the same surface. By attaching the contact before instead of after the formation of the thin diffused region, the contact doping impurity diffuses under the fused contact alloy material. The contact doping impurity can be a different element from the vapor diffusant, but both must be dopants for the appropriate conductivity type, and should preferably have similar surface concentrations and diffusion rates under the device diffusion conditions. There is thus provided a junction having a similar resistivity gradient across the entire area of the diffused region.

Figure 1:
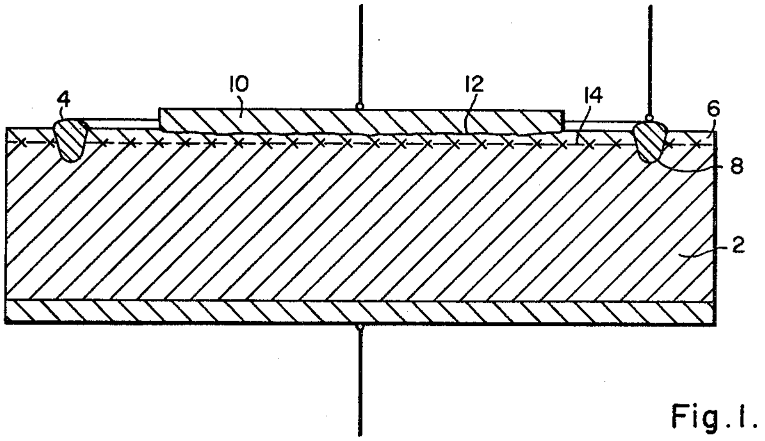
FIGURE 1 is an enlarged vertical cross section of diffused base transistor showing a base contact made by conventional techniques.
Figure 2:
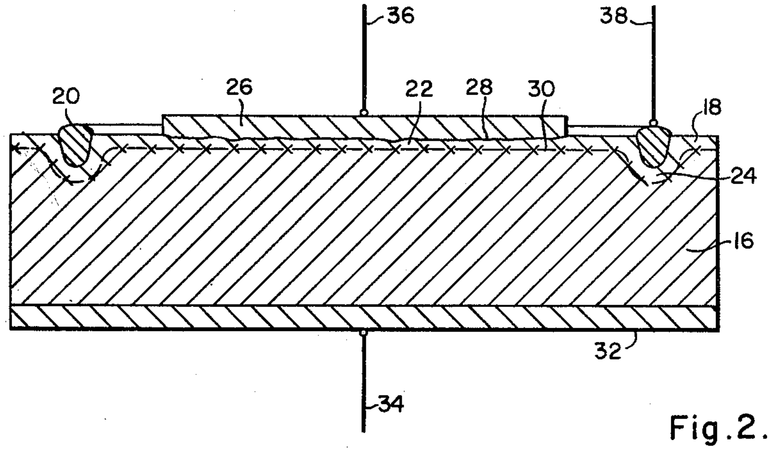
FIGURE 2 is an enlarged vertical cross section of a diffused base transistor showing a base contact made in accordance with this invention.

Referring to FIGURES 1 and 2, there is shown a comparison of a diffused base transistor utilizing the conventional technique of attaching the base contact after the diffused base region is formed as shown in FIGURE 1 with a diffused base transistor utilizing the present novel technique of attaching the base contact before the diffused base region is formed as shown in FIGURE 2.

Referring specifically to FIGURE 1 showing the base contact attached by the conventional method, the transistor device is formed by first preparing a wafer 2 of semiconductor material having a first type of semiconductivity. The diffused base region 6 is then formed by vapor diffusing a conductivity determining impurity which will impart a second type of semiconductivity into a surface of wafer 2. The base ohmic contact 4 comprising an annular shaped body having a second type of conductivity is then fused to the diffused base region 6. Normally the penetration of the base contact alloy 4 is closely controlled so that the deepest penetration thereof does not extend appreciably whereby the resistivity profile of the diffused base region 6 is disturbed. However, in instances of extremely thin diffused base regions it often occurs that the point of deepest penetration of the alloy extends through the diffused region to form an undesired abrupt junction area as at 8. The device is completed by fusing an alloy disk 10 which will produce a regrowth layer having the same type of conductivity as the unconverted portion of wafer 2 to the diffused base region 6. There is thus provided a PNP or NPN transistor device having an abrupt emitter junction 12 and a graded collector junction 14, the graded collector junction 14 being electrically in parallel with the abrupt junction 8 caused by the penetration of the base contact alloy 4.

Referring to FIGURE 2, there is shown a transistor device made in accordance with the improved method of the present invention which comprises first preparing a wafer 16 of semiconductor material having a first type of semiconductivity. The base contact 20 comprising a body having an annular configuration and a doping action in the semiconductor to produce a second type of conductivity is then attached to a surface of the wafer 16. The diffused base region 18 is then formed by vapor diffusing an impurity which will impart a second type of semiconductivity into the same surface of the wafer 16 for a time to permit the desired vapor-solid diffusion of the surface region as at 22 and the solid-solid diffusion of the impurity into the crystalline structure of wafer 16 in the area immediately under the diffused base alloy as at 24. An alloy disk 26 which will produce a regrowth layer having a first type of semiconductivity is then fused to base contact region 18. A PNP or NPN transistor device is thus formed having an abrupt emitter junction 28 and a collector junction 30, the device having a similar resistivity gradient across the entire area of the diffused base region 18.

According to a preferred method of making a transistor device as shown in FIGURE 2; the base contact 20 having an annular configuration and consisting, for example, of a 90% lead–10% antimony alloy is first fused to a surface of P-type germanium wafer 16 at a temperature of about 500° C. for about three minutes. The diffused base region 18 is formed next by vapor diffusing an impurity which will impart an N-type of semiconductivity, such as arsenic, into the same surface of wafer 16 as the attached base contact 20. A similar resistivity gradient is provided by the solid-solid diffusion of the base contact doping impurity into the crystalline structure of the wafer 16 immediately under the base contact alloy 20 to convert this area from P-type to N-type as at 24. This solid-solid diffusion occurs simultaneously with the vapor-solid diffusion which occurs in the unobstructed areas of the wafer surface. An alloy disk 26 which will produce a regrowth region having a P-type semiconductivity, such as indium, and an outside diameter slightly less than the inside diameter of annular contact 20 is then fused to the diffused base region 18, within and in concentric relation to the diffused base contact 20, to provide an abrupt junction as at 30. A non-rectifying contact 32 is then attached to wafer 26 and wire leads 34, 36 and 38 are attached to contacts 32, 26 and 20, respectively, to complete the device. There is thus provided a PNP transistor device having an abrupt emitter junction, a diffused collector junction having a similar resistivity gradient and a base contact disposed in close relationship to the emitter region which will minimize transverse base resistance.

The following example is illustrative of the novel teaching of this invention:

*Example I*

Two sets of diffused junction diodes were produced in which the ohmic contacts to the diffused layer were applied after this layer was formed in the first set and before this layer was formed in the second set. In the first set, six wafers of P-type germanium were maintained at a temperature of about 800° C. and a thin layer portion of each wafer was converted to N-type by diffusing the arsenic vapor in equilibrium with solid arsenic at a temperature of 180° C. for one hour into the exposed surfaces thereof, in an evacuated quartz chamber. An ohmic contact consisting of a 90% lead–10% antimony alloy was then fused at a temperature of 500° C. for three minutes to the converted N-type portion of each wafer. A second contact consisting of pure indium was then attached to the unconverted portion of each wafer. All units were electrolytically etched. The units were then electrically tested and exhibited good rectification characteristics, but with the low reverse breakdown voltages characteristic of abrupt junction diodes. Three units exhibited reverse currents of 50 milliamps at 60 volts, one unit at 50 volts, one unit at 40 volts, and one unit at 25 volts.

In the second set, employing the novel technique of the present invention four wafers of P-type germanium taken from the same ingot were used. Ohmic contacts consisting of a 90% lead–10% antimony alloy were first fused to a surface of each wafer at a temperature of 500° C. for three minutes. A relatively thin diffused region was then formed in the same surface of each wafer by diffusing the arsenic vapor in equilibrium with solid arsenic at a temperature of 180° C. for one hour into the wafers which were held at 800° C. to convert a thin layer of the P-type germanium to N-type. Contacts consisting of pure indium were then attached to the unconverted portion of each wafer. The four units were electrolytically etched as the previous set and then electrically tested. The four units exhibited lower leakages than the first set; the two best units exhibited reverse leakages of 15 milliamps and 25 milliamps at 80 volts.

Samples of each of the above runs were then more closely examined to determine whether the junction configurations of the two methods had been appreciably affected by the penetration of the alloy contact. Metallographic sectioning techniques were employed on one unit from each run and polished cross sections were etched with a solution of three parts of nitric acid, one part hydrofluoric acid and one part of glacial acetic acid to delineate the respective junctions. On the unit prepared in accordance with the present invention, a curved line representing the junction was observed under the lead-antimony contact thus indicating a definite movement of the PN junction caused by the solid-solid diffusion occurring under the contact simultaneously with the vapor-solid diffusion at the surface of the unit. In the unit prepared by the conventional method of attaching the ohmic contact after instead of before the diffusion step, no separate junction line could be observed under the alloyed contact as it virtually superimposed with the alloy interface.

While this invention has been described with particular reference to the use of germanium as the semiconductor material employed, it will be understood that the teachings are equally applicable to other semiconductor materials including silicon, Group III–V compounds such as gallium arsenide, aluminum phosphide and the like, and Group II–VI compounds such as zinc selenide and cadmium telluride. In addition thereto, other conductivity determining impurities than arsenic and antimony can be readily employed depending on the semiconductor and the particular type of conductivity desired.

While the invention has been described with reference to at least one particular embodiment and examples illustrating the novel concept disclosed, it will be understood that modification, substitution, and the like may be made therein without departing from its scope.

What is claimed is:

1. A method of making a semiconductor device containing two p-n junctions comprising, disposing a body comprised of a doping material capable of imparting a second type of semiconductivity to a wafer of a semiconductor material having a first type of semiconductivity upon one surface of said wafer, forming a shallow region of a second type of semiconductivity in said wafer of semiconductor material by alloying, said shallow region extending from one surface of said wafer into said wafer forming a thicker region of said second type of semiconductivity in said wafer by vapor diffusion, said vapor entering said wafer at said one surface and diffusing into said wafer to a depth greater than the penetration of said alloying but less than the thickness of said wafer, said region of second type semiconductivity formed by alloying merging with and becoming a part of said region of second type of semiconductivity formed by vapor diffusion, reconverting by alloying only a portion of said region of second type of semiconductivity to a second region of said first type of semiconductivity, said second region of said first type of semiconductivity extending from said one surface into said wafer to a depth less than the thickness of said region of second type semiconductivity.

2. A method of making a semiconductor device containing two p-n junctions comprising, disposing a body comprised of a doping material capable of imparting a second type of semiconductivity to a wafer of a semiconductor material having a first type of semiconductivity upon one surface of said wafer, forming a shallow region of a second type of semiconductivity in said wafer of semiconductor material by alloying, said shallow region extending from one surface of said wafer into said wafer, forming a thicker region of said second type of semiconductivity in said wafer by vapor diffusion, said vapor entering said wafer at said one surface and diffusing into said wafer to a depth greater than the penetration of said alloying but less than the thickness of said wafer, said region of second type semiconductivity formed by alloying merging with and becoming a part of said region of second type of semiconductivity formed by vapor diffusion, reconverting by alloying only a portion of said region of second type of semiconductivity to a second region of said first type of semiconductivity, said second region of said first type of semiconductivity extending from said one surface into said wafer to a depth less than the thickness of said region of second type semiconductivity, affixing ohmic contacts to said regions of first type of semiconductivity and making ohmic contact to said region of second type semiconductivity through said body of doping material.

3. A method of making a semiconductor device containing two p-n junctions comprising, disposing a body comprised of a doping material capable of imparting a second type of semiconductivity to a wafer of a semiconductor material having a first type of semiconductivity upon one surface of said wafer, forming a shallow region of a second type of semiconductivity in said wafer of semiconductor material by melting and recrystallizing whereby a portion of said doping material remains affixed to said one surface, said shallow region extending from one surface of said wafer into said body, forming a thicker region of said second type of semiconductivity in said wafer by vapor diffusion, said vapor entering said wafer at said one surface and diffusing into said wafer to a depth greater than the penetration of said alloying but less than the thickness of said body, said region of second type semiconductivity formed by alloying merging with and becoming a part of said region of second type of semiconductivity formed by vapor diffusion, reconverting by alloying only a portion of said region of second type of semiconductivity to a second region of said first type of semiconductivity, said second region of said first type of semiconductivity extending from said one surface into said wafer to a depth less than the thickness of said region of second type semiconductivity, affixing ohmic contacts to said regions of first type of semiconductivity, and making ohmic contacts to said region of second type of semiconductivity through said portion of said doping material.

4. A method of making a semiconductor device containing two p-n junctions comprising, disposing an annular body comprised of a doping material capable of imparting a second type of semiconductivity to a wafer of a semiconductor material having a first type of semiconductivity upon one surface of said wafer forming a shallow region of a second type of semiconductivity in said wafer of semiconductor material by alloying, said shallow region extending from one surface of said wafer into said wafer, forming a thicker region of said second type of semiconductivity in said wafer by vapor diffusion, said vapor entering said wafer at said one surface and diffusing into said wafer to a depth greater than the penetration of said alloying but less than the thickness of said wafer, said region of second type semiconductivity formed by alloying merging with and becoming a part of said region of second type of semiconductivity formed by vapor diffusion, reconverting by alloying only a portion of said region of second type of semiconductivity enclosed within the aforesaid annular body to a second region of said first type of semiconductivity, said second region of said first type of semiconductivity extending from said one surface into said wafer to a depth less than the thickness of said region of second type semiconductivity affixing ohmic contacts to said regions of first type of semiconductivity, and making ohmic contact to said region of second type semiconductivity through said body of doping material.

References Cited in the file of this patent

UNITED STATES PATENTS 2,829,075 Pankove ............... Apr. 1, 1958
2,874,083 Stripp et al. ............. Feb. 17, 1959
3,010,855 Barson et al. ............ Nov. 28, 1961

FOREIGN PATENTS 728,129 Great Britain ............ Apr. 13, 1955